US008735246B2

(12) United States Patent
Kuboi et al.

(10) Patent No.: US 8,735,246 B2
(45) Date of Patent: May 27, 2014

(54) METHOD FOR MANUFACTURING NONVOLATILE SEMICONDUCTOR MEMORY DEVICE

(75) Inventors: Shuichi Kuboi, Kanagawa-ken (JP); Tadashi Iguchi, Mie-ken (JP); Masao Iwase, Mie-ken (JP); Toru Matsuda, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,493

(22) Filed: Aug. 31, 2012

(65) Prior Publication Data
US 2013/0228841 A1 Sep. 5, 2013

(30) Foreign Application Priority Data

Feb. 24, 2012 (JP) ................. 2012-039327

(51) Int. Cl.
*H01L 21/338* (2006.01)
(52) U.S. Cl.
USPC ......................................... 438/257
(58) Field of Classification Search
CPC .............. H01L 29/7813; H01L 29/66734; H01L 29/4236; H01L 29/66666; H01L 29/7827
USPC ............ 438/270, 257, 694, 697, 314
See application file for complete search history.

(56) References Cited

U.S. PATENT DOCUMENTS

| 2011/0031547 A1 | 2/2011 | Watanabe |
| 2011/0057250 A1 | 3/2011 | Higashi |
| 2011/0115014 A1 | 5/2011 | Ichinose et al. |
| 2011/0180866 A1 | 7/2011 | Matsuda et al. |

FOREIGN PATENT DOCUMENTS

| JP | 2010-225694 A | 10/2010 |
| JP | 2011-54899 A | 3/2011 |
| JP | 2011-108921 A | 6/2011 |
| JP | 2011-138945 A | 7/2011 |

*Primary Examiner* — Nikolay Yushin
(74) *Attorney, Agent, or Firm* — Oblon, Spivak, McClelland, Maier & Neustadt, L.L.P.

(57) ABSTRACT

According to one embodiment, a method is disclosed for manufacturing nonvolatile semiconductor memory device including forming a stacked body by alternately stacking an electrode layer and a layer-to-be-etched, and forming an oxidized layer between the layer-to-be-etched provided at least in any side of an upper side and a lower side of the electrode layer and the electrode layer. The method can include forming a groove which passes through the stacked body. The method can include embedding an insulating body within the groove. The method can include forming a hole which passes through the stacked body. The method can include selectively removing the layer-to-be-etched via the hole. The method can include forming a charge storage layer in an inner side of the hole. The method can include forming a channel body layer in an inner side of the charge storage layer.

16 Claims, 7 Drawing Sheets

METHOD FOR MANUFACTURING NONVOLATILE SEMICONDUCTOR MEMORY DEVICE

CROSS-REFERENCE TO RELATED APPLICATIONS

This application is based upon and claims the benefit of priority from the prior Japanese Patent Application No. 2012-039327, filed on Feb. 24, 2012; the entire contents of which are incorporated herein by reference.

FIELD

Embodiments described herein relate generally to a method for manufacturing nonvolatile semiconductor memory device and a nonvolatile semiconductor memory device.

BACKGROUND

In a field of a nonvolatile semiconductor memory device, a three-dimensional stacked memory which can achieve a high integration without being comparatively constrained by a limit of a resolving power in a photolithography method is noticed.

In a manufacturing of the three-dimensional stacked memory, for example, a hole is formed in a stacked body in which a plurality of electrode layers serving as a control gate and the layers-to-be-etched are alternately stacked, the layers-to-be-etched are removed, a charge storage layer is thereafter formed in a side wall of the hole, and a channel is formed within the hole.

Accordingly, the more the layers are increased, the higher an aspect ratio of the hole becomes, so that there is a risk that an etching process which is excellent in a shape controllability is hard.

DETAILED DESCRIPTION

Figure 1:
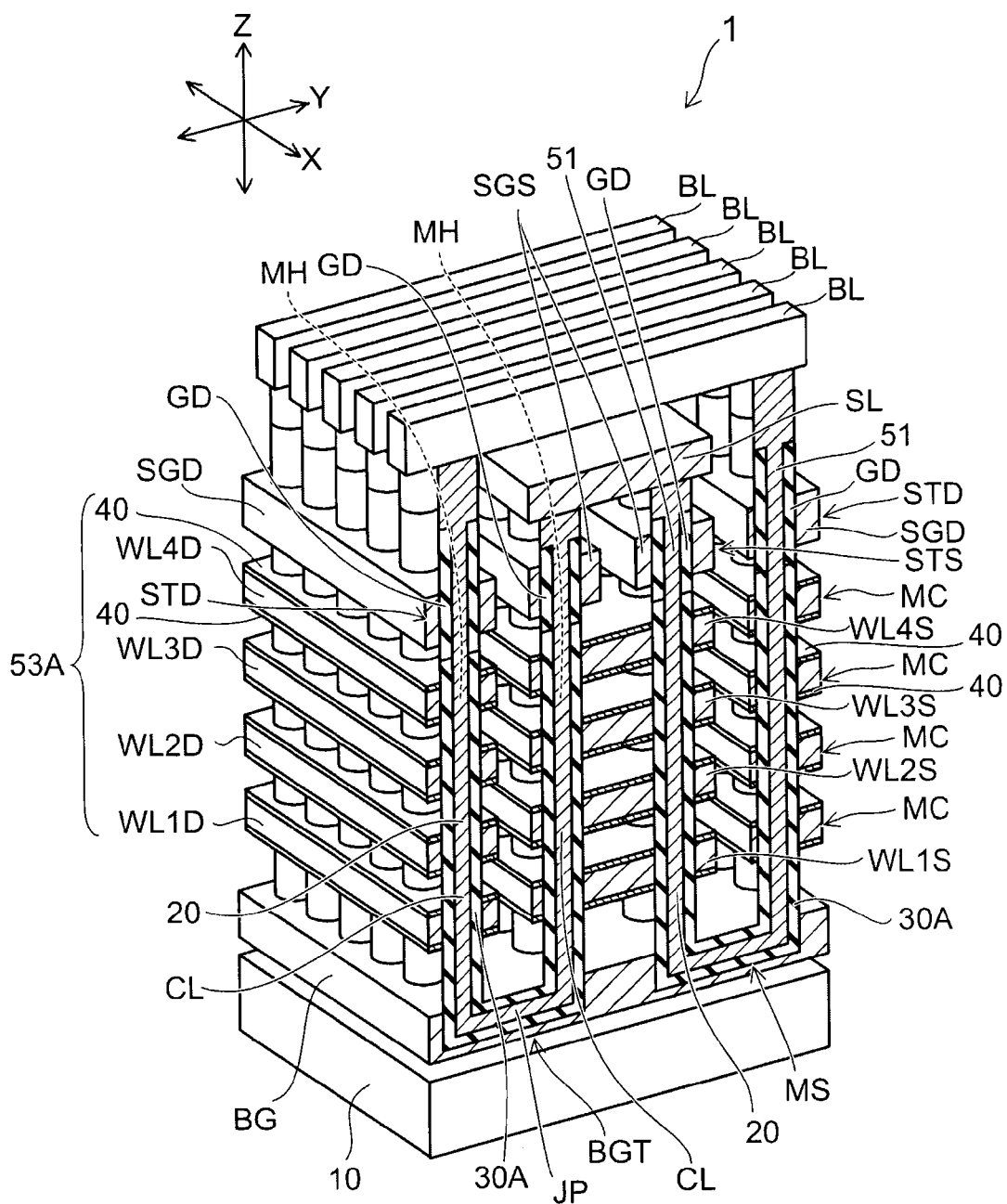
FIG. 1 is a schematic perspective view of a memory cell array in the nonvolatile semiconductor memory device according to the first embodiment.

In general, according to one embodiment, a method is disclosed for manufacturing nonvolatile semiconductor memory device including forming a stacked body by alternately stacking an electrode layer and a layer-to-be-etched and forming an oxidized layer between the layer-to-be-etched provided at least in any side of an upper side and a lower side of the electrode layer and the electrode layer. The method can include forming a groove which passes through the stacked body in a stacking direction. The method can include embedding an insulating body within the groove. The method can include forming a hole which passes through the stacked body in the stacking direction. The method can include selectively removing the layer-to-be-etched via the hole. The method can include forming a charge storage layer in an inner side of the hole. The method can include forming a channel body layer in an inner side of the charge storage layer.

An embodiment will be illustrated below with reference to the accompanying drawings. In this case, in each of the drawings, the same reference numerals are attached to the same configuration elements, and a detailed description will be appropriately omitted.

Further, in each of the following drawings, an XYZ orthogonal coordinate system is introduced. In this coordinate system, two directions which are parallel directions to a main face of a board 10 and are orthogonal to each other are set to an X direction and a Y direction, and a direction which is orthogonal to both of the X direction and the Y direction is set to a Z direction.

First Embodiment

First of all, before illustrating a method for manufacturing a nonvolatile semiconductor memory device according to a first embodiment, a nonvolatile semiconductor memory device 1 which is manufactured by the manufacturing method is illustrated.

FIG. 1 is a schematic perspective view of a memory cell array in the nonvolatile semiconductor memory device according to the first embodiment.

In FIG. 1, in order to make the drawing easily viewable, an illustration of the other insulating portions than the insulating layer formed in a side wall of a memory hole MH is omitted. The insulating portion will be illustrated by using FIG. 6B which is a schematic cross sectional view of the memory cell array.

Figure 2:
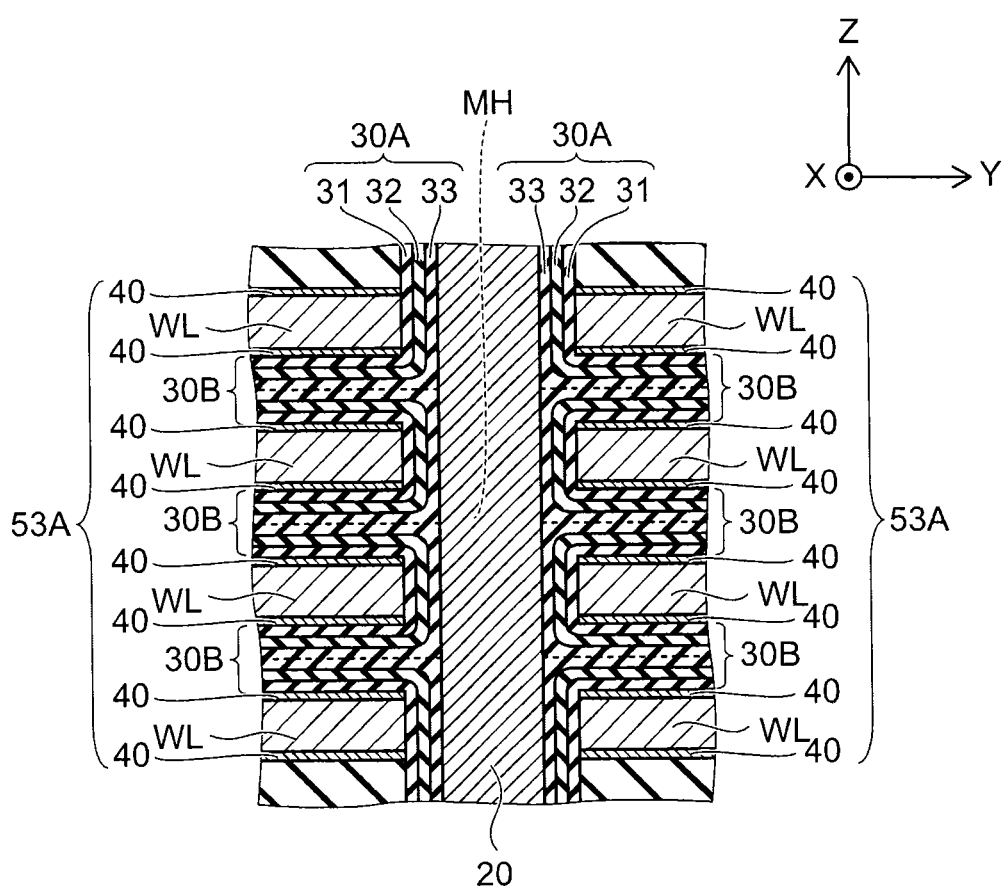
FIG. 2 is a schematic enlarged cross sectional view of a portion which is provided with the memory cell in FIG. 1.

FIG. 2 is a schematic enlarged cross sectional view of a portion which is provided with the memory cell in FIG. 1.

In the nonvolatile semiconductor memory device 1, a back gate BG is provided on a board 10 via an insulating layer which is not illustrated. The board 10 including the insulating layer is set to a foundation layer. An active element such as a transistor, and a passive element such as a resistance, a capacity or the like may be provided within the board 10. The back gate BG is, for example, a silicon (Si) layer to which an impurity element is added, and which has a conductivity. In this case, in FIG. 3A, a semiconductor layer (a phosphorous added silicon layer) 11 corresponds to the back gate BG.

On the back gate BG, a plurality of insulating layers 30B (refer to FIG. 2), and a plurality of electrode layers WL1D, WL2D, WL3D, WL4D, WL1S, WL2S, WL3S and WL4S are stacked respectively alternately.

The electrode layer WL1D and the electrode layer WL1S are provided on the same hierarchy, and show the electrode layers which are a first layer from the bottom. The electrode layer WL2D and the electrode layer WL2S are provided on the same hierarchy and show the electrode layers which are a second layer from the bottom. The electrode layer WL3D and the electrode layer WL3S are provided on the same hierarchy and show the electrode layers which are a third layer from the bottom. The electrode layer WL4D and the electrode layer WL4S are provided on the same hierarchy and show the electrode layers which are a fourth layer from the bottom.

The electrode layer WL1D and the electrode layer WL1S are segmented in the Y direction. The electrode layer WL2D and the electrode layer WL2S are segmented in the Y direction. The electrode layer WL3D and the electrode layer WL3S are segmented in the Y direction. The electrode layer WL4D and the electrode layer WL4S are segmented in the Y direction.

Figure 6A:
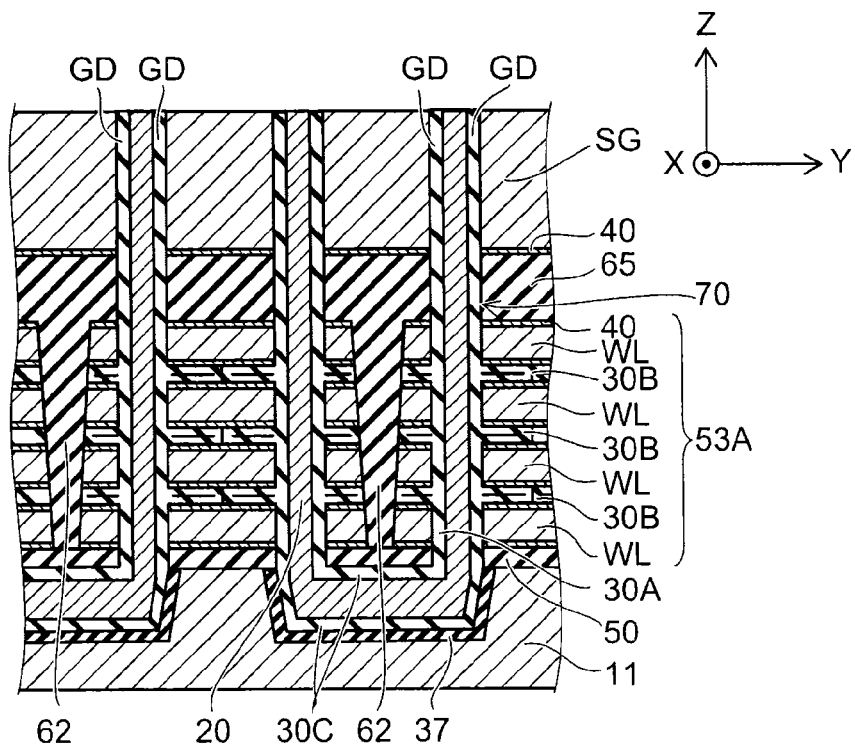
FIG. 6A and FIG. 6B are schematic process cross sectional views for illustrating the method for manufacturing the nonvolatile semiconductor memory device 1 according to the first embodiment.
Figure 6B:
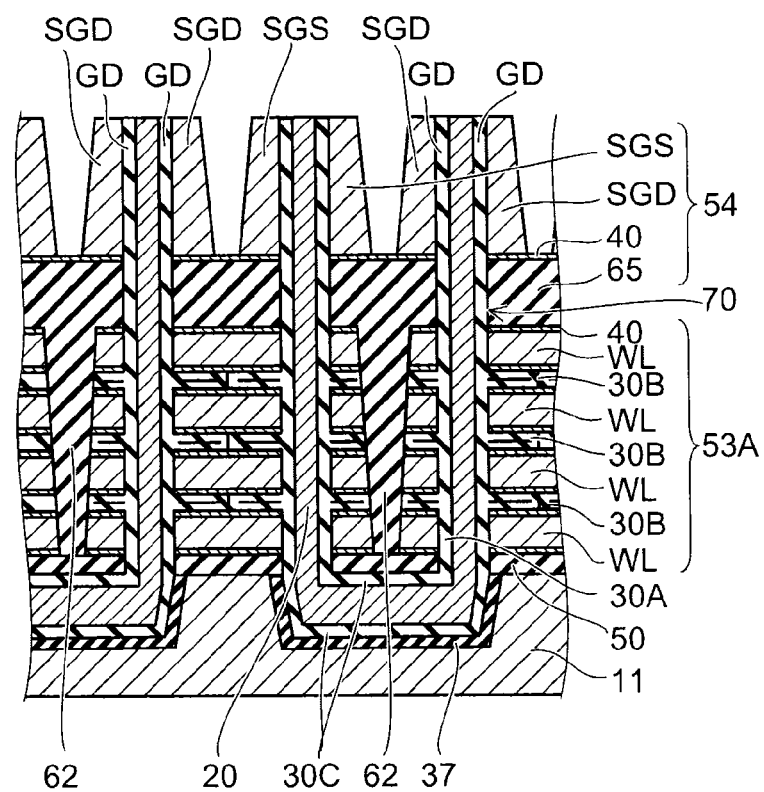

An insulating layer 62 shown in FIG. 6B is provided between the electrode layer WL1D and the electrode layer WL1S, between the electrode layer WL2D and the electrode layer WL2S, between the electrode layer WL3D and the electrode layer WL3S, between the electrode layer WL4D and the electrode layer WL4S, between the adjacent electrode layers WL1S, between the adjacent electrode layers WL2S, between the adjacent electrode layers WL3S, and between the adjacent electrode layers WL4S.

The electrode layers WL1D, WL2D, WL3D and WL4D are provided between the back gate BG and a drain side selector gate SGD.

An oxidized layer 40 is provided at least in any side of an upper side and a lower side of the electrode layers WL1D, WL2D, WL3D and WL4D.

The electrode layers WL1S, WL2S, WL3S and WL4S are provided between the back gate BG and a source side selector gate SGS. The oxidized layer 40 is provided at least in any side of the upper side and the lower side of the electrode layers WL1S, WL2S, WL3S and WL4S.

In this case, in the embodiment, there is illustrated a case that the oxidized layer 40 is provided in the upper side and the lower side of each of the electrode layers WL1D, WL2D, WL3D, WL4D, WL1S, WL2S, WL3S and WL4S.

The number of layer of the electrode layers WL1D, WL2D, WL3D, WL4D, WL1S, WL2S, WL3S and WL4S is optional, and is not limited to four layers which is illustrated in FIG. 1. Further, in the following description, each of the electrode layers WL1D, WL2D, WL3D, WL4D, WL1S, WL2S, WL3S and WL4S may be expressed simply as the electrode layer WL.

Each of a plurality of electrode layers WL is, for example, a semiconductor layer to which an impurity element is added and which has a conductivity. The impurity element is, for example, group-13 elements such as a boron (B) or the like. Alternatively, group-15 elements such as a phosphorous (P), an arsenic (As) or the like may be used as the impurity element. In the following description, a description will be given by listing up a polysilicon layer including a boron as one example of the electrode layer WL.

The oxidized layer 40 is formed by an oxide. The oxide is, for example, a silicon oxide ($SiO_2$), an aluminum oxide ($Al_2O_3$) and the like.

Further, as mentioned later, a formation of the oxidized layer 40 can be carried out by a method for piling up the oxide, and a method for oxidizing a surface of at least any one of the electrode layer WL and a layer-to-be-etched 52 (corresponding to one example of the first layer).

Accordingly, for example, the impurity element added to the electrode layer WL is included in the oxidized layer 40 which is formed by the method for oxidizing the surface of at least any one of the electrode layer WL and the layer-to-be-etched 52.

In other words, the oxidized layer 40 can include at least any one which is selected from a group constituted by the silicon, the aluminum, group-13 elements and group-15 elements.

In this case, an effect of providing the oxidized layer 40 will be mentioned later.

An insulating layer 30B has, for example, an ONO structure mentioned later.

A stacked body 53A has a plurality of electrode layers WL, and a plurality of insulating layers 30B which are stacked respectively alternately, and the oxidized layers 40 provided with respect to the insulating layer 30B at least in any side of the upper side and the lower side of the electrode layer WL. The stacked body 53A is provided on the foundation layer.

The drain side selector gate SGD is provided on the electrode layer WL4D via an insulating layer which is not illustrated. The drain side selector gate SGD is, for example, a silicon layer to which the impurity element is added and which has a conductivity.

The source side selector gate SGS is provided on the electrode layer WL4S via an insulating layer which is not illustrated. The source side selector gate SGS is, for example, a silicon layer to which the impurity element is added and which has a conductivity.

The drain side selector gate SGD and the source side selector gate SGS are segmented in the Y direction. In this case, in the following description, the drain side selector gate SGD and the source side selector gate SGS may be expressed simply as a selector gate SG without being differentiated.

A source line SL is provided on the source side selector gate SGS via an insulating layer which is not illustrated. The source line SL is a metal layer, or a silicon layer to which the impurity element is added and which has a conductivity.

A plurality of bit lines BL are provided on the drain side selector gate SGD and the source line SL via an insulating layer which is not illustrated. Each of the bit lines BL extends in the Y direction.

A plurality of U-shaped memory holes MH are formed in the back gate BG and the stacked body 53A on the back gate BG. For example, in the electrode layers WL1D to WL4D and the drain side selector gate SGD, there is formed a hole which passes through them and extends in a Z direction (a stacking direction). In the electrode layers WL1S to WL4S and the source side selector gate SGS, there is formed a hole which passes through them and extends in the Z direction. A pair of holes extending in the Z direction are connected via a concave portion (a space portion) which is formed within the back gate BG, and configure the U-shaped memory hole MH.

A channel body layer 20 is provided in a U-shaped form, in an inner side of the memory hole MH. The channel body layer 20 is, for example, an additive-free polysilicon layer. A memory layer 30A is provided between the channel body layer 20 and the side wall of the memory hole MH.

In other words, the memory layer 30A is provided in the side wall of the memory hole MH which passes through the stacked body 53A in the stacking direction of the stacked body 53A. Further, the channel body layer 20 is provided in the inner side of the memory layer 30A which is provided within the memory hole MH. Further, each of a plurality of electrode layers WL comes to a gate electrode which is opposed to the channel body layer 20 via the memory layer 30A.

A gate insulating layer GD is provided between the channel body layer 20 and the drain side selector gate SGD. The gate insulating layer GD is provided between the channel body layer 20 and the source side selector gate SGS.

In this case, not applying only to the configuration in which all of the memory holes MH are filled with the channel body layer 20, it may be configured such that the channel body layer 20 is formed in such a manner that a cavity portion is left in a center shaft side of the memory hole MH, and an insulating material is filled in the cavity portion in the inner side of the memory hole MH.

The memory layer 30A has, for example, an oxide-nitride-oxide (ONO) structure in which a silicon nitride film is pinched by a pair of silicon oxide films. As shown in FIG. 2, an insulating layer 31, a charge storage layer 32 and an insulating layer 33 are provided in this order from the electrode layer WL side between each of the electrode layers WL and the channel body layer 20. A set of the insulating layer 31, the charge storage layer 32 and the insulating layer 33 is the memory layer 30A. The insulating layer 31 comes into contact with the electrode layer WL, the insulating layer 33 comes into contact with the channel body layer 20, and the charge storage layer 32 is provided between the insulating layer 31 and the insulating layer 33. In this case, the insulating layer 30B is configured such that the layers having the ONO structure are opposed so as to form two layers.

The channel body layer 20 serves as a channel in a transistor which configures the memory cell, the electrode layer WL serves as a control gate, and the charge storage layer 32 serves as a data memory layer which stores an electric charge injected form the channel body layer 20. In other words, a memory cell MC configured such that the control gate surrounds a periphery of the channel is formed in an intersecting portion between the channel body layer 20 and each of the electrode layers WL.

The nonvolatile semiconductor memory device 1 is a nonvolatile semiconductor memory device which can electrically freely carry out a deletion and a writing of the data, and can retain the memory contents even if a power supply is turned off.

The memory cell MC is, for example, a memory cell of a charge trap structure. The charge storage layer 32 has a lot of traps which confine the electric charges (electrons), and is, for example, a silicon nitride film. The insulating layer 33 is, for example, a silicon oxide film, and comes to an electric potential barrier at a time when the electric charge is injected to the charge storage layer 32 from the channel body layer 20 or at a time when the electric charge stored in the charge storage layer 32 is diffused to the channel body layer 20. The insulating layer 31 is, for example, a silicon oxide film, and prevents the electric charge stored in the charge storage layer 32 from being diffused to the electrode layer WL. The insulating layer 31 and the insulating layer 33 may be configured by a plurality of layers.

The drain side selector gate SGD, the channel body layer 20 and the gate insulating layer GD between the drain side selector gate SGD and the channel body layer 20 configure a drain side selector transistor STD. The channel body layer 20 above the drain side selector transistor STD is connected to the bit line BL.

The source side selector gate SGS, the channel body layer 20 and the gate insulating layer GD between the source side selector gate SGS and the channel body layer 20 configure a source side selector transistor STS. The channel body layer 20 above the source side selector transistor STS is connected to the source line SL.

The back gate BG, and the channel body layer 20 and the memory layer 30A which are provided within the back gate BG configure a back gate transistor BGT.

A plurality of memory cells MC having each of the electrode layers WL4D to WL1D as the control gate are provided between the drain side selector transistor STD and the back gate transistor BGT. In the same manner, a plurality of memory cells MC having each of the electrode layers WL1S to WL4S as the control gate are provided between the back gate transistor BGT and the source side selector transistor STS.

The plurality of memory cells MC, the train side selector transistor STD, the back gate transistor BGT and the source side selector transistor STS are connected in series through the channel body layer 20, and configure one U-shaped memory string MS.

One memory string MS has a pair of columnar portions CL which extend in the stacking direction of the stacked body 53A including a plurality of electrode layers WL, and a junction portion JP which is embedded in the back gate BG and connects a pair of columnar portions CL. Since a plurality of memory strings MS are arranged in the X direction and the Y direction, a plurality of memory cells are three-dimensionally provided in the X direction, the Y direction and the Z direction.

A plurality of memory strings MS are provided in the memory cell array region in the board 10. For example, a peripheral circuit which controls the memory cell array and is not illustrated is provided in the periphery of the memory cell array region in the board 10. In this case, since a known technique can be applied to the peripheral circuit, a description of the peripheral circuit will be omitted.

Next, as description will be illustrated a method for manufacturing the nonvolatile semiconductor memory device 1.

FIG. 3A to FIG. 6B are schematic process cross sectional views for illustrating the method for manufacturing the nonvolatile semiconductor memory device 1 according to the first embodiment.

In this case, the schematic process cross sectional view shown below shows a cross section at a time of cutting a center of the memory hole MH in parallel to the Y direction in FIG. 1.

Figure 3A:
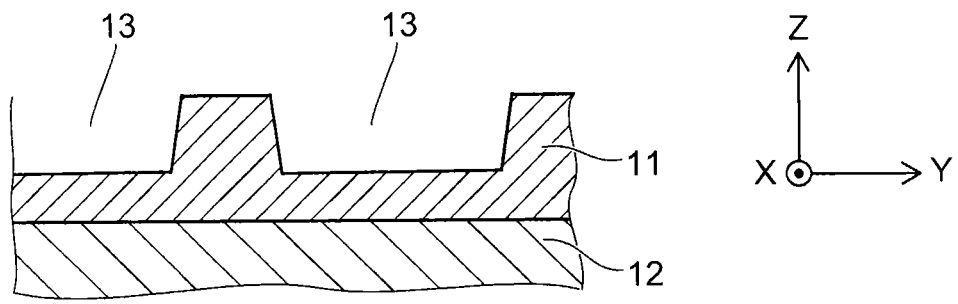
FIG. 3A to FIG. 3C are schematic process cross sectional views for illustrating the method for manufacturing the nonvolatile semiconductor memory device 1 according to the first embodiment.

First of all, as shown in FIG. 3A, the semiconductor layer 11 including the impurity element is formed on a foundation layer 12. The semiconductor layer 11 is, for example, a phosphorous added silicon layer. The phosphorous added silicon layer corresponds to the back gate BG mentioned above. In the foundation layer 12, for example, a transistor and a wiring in the peripheral circuit portion which controls the memory cell, an interlayer insulating layer and the like can be formed.

Subsequently, a groove 13 is formed in the semiconductor layer 11 by using a photolithography method and a reactive ion etching (RIE) method. A position of the groove 13 corresponds to a position of the junction portion JP which connects the lower ends of the memory holes MH.

Figure 3B:
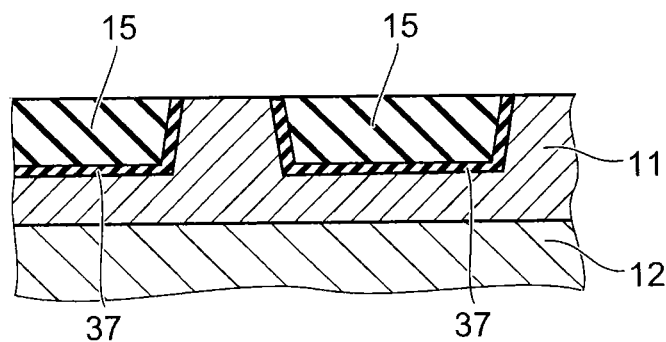

Next, as shown in FIG. 3B, an insulating layer 37 is formed within the groove 13, and an additive-free silicon sacrifice layer 15 is formed within the groove 13 via the insulating layer 37. The additive-free silicon sacrifice layer 15 is, for example, a non-doped silicon layer. A surplus portion of the additive-free silicon sacrifice layer 15 is removed by an etch back and a surface of the semiconductor layer 11 between the adjacent additive-free silicon sacrifice layers 15 is exposed.

In this stage, on the foundation layer 12, there is formed the semiconductor layer 11 which has an impurity including region including the impurity element, and an etched region in which an impurity concentration is lower than the impurity including region. The impurity including region is the semiconductor layer 11 which is pinched by the adjacent additive-free silicon sacrifice layers 15, and the etched region is the additive-free silicon sacrifice layer 15. A plurality of additive-free silicon sacrifice layers 15 are arranged at a predetermined distance in the X direction or the Y direction.

Figure 3C:
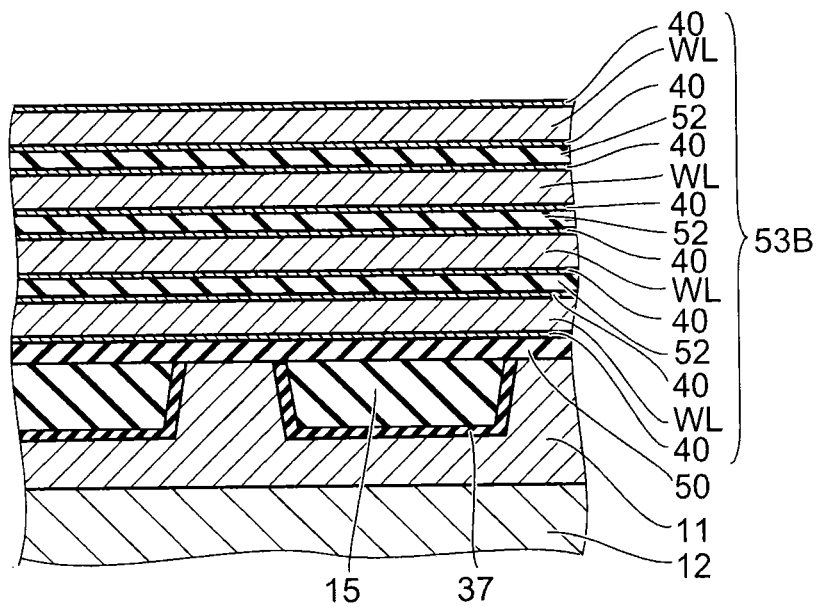

Next, as shown in FIG. 3C, an insulating layer 50 is formed on the semiconductor layer 11 and on the additive-free silicon sacrifice layer 15. The insulating layer 50 serves as a stop layer at a time of etching. A material of the insulating layer 50 is, for example, a silicon oxide ($SiO_2$).

Subsequently, a stacked body 53B is formed on the foundation layer 12 via the insulating layer 50.

For example, the stacked body 53B is formed by alternately stacking the electrode layer WL and the layer-to-be-etched 52, and forming the oxidized layer 40 with respect to the layer-to-be-etched 52 at least any side of the upper side and the lower side of the electrode layer WL.

The electrode layer WL is, for example, a polysilicon layer to which the impurity is added. The electrode layer WL is, for example, a boron added polysilicon layer. The electrode layer WL has a conductivity which is sufficient as the gate electrode. The layer-to-be-etched 52 is an additive-free polysilicon layer.

A formation of the oxidized layer 40 can be carried out, for example, by piling up the oxide.

The oxide is, for example, a silicon oxide ($SiO_2$), an aluminum oxide ($Al_2O_3$) or the like.

Further, a formation of the oxidized layer 40 can be carried out by oxidizing a surface of at least any of the electrode layer WL and the layer-to-be-etched 52.

In this case, the formation of the oxidized layer 40 can also be carried out by removing the layer-to-be-etched 52 via a hole 70 mentioned later, and thereafter oxidizing the surface of the electrode layer WL via the hole 70.

The stacked body 53B can be formed by repeatedly stacking the oxidized layer 40, the electrode layer WL, the oxidized layer 40 and the layer-to-be-etched 52, for example, using a chemical vapor deposition (CVD) method.

For example, the stacked body 53B can be formed by piling up the oxide on the insulating layer 50 by using the CVD method so as to form the oxidized layer 40, by forming the boron added polysilicon layer on the oxidized layer 40 by using the CVD method so as to form the electrode layer WL, by piling up the oxide on the electrode layer WL by using the CVD method so as to form the oxidized layer 40, by forming the additive-free polysilicon layer on the oxidized layer 40 by using the CVD method so as to form the layer-to-be-etched 52, and thereafter carrying out the same manner.

Further, the oxidized layer 40 can be formed by sequentially oxidizing the surface of the electrode layer WL corresponding to the boron added polysilicon layer, and the surface of the layer-to-be-etched 52 corresponding to the additive-free polysilicon layer. Further, in the case that the insulating layer 50 is formed from the silicon oxide, the formation of the oxidized layer 40 in the bottom layer can be omitted.

For example, the stacked body 53B can be formed by forming the boron added polysilicon layer on the insulating layer 50 by using the CVD method so as to form the electrode layer WL, by applying an oxidizing process so as to form the oxidized layer 40 on the surface of the electrode layer WL, by forming the additive-free polysilicon layer on the oxidized layer 40 by using the CVD method so as to form the layer-to-be-etched 52, by applying the oxidizing process so as to form the oxidized layer 40 on the surface of the layer-to-be-etched 52, and thereafter carrying out the same manner.

In this case, the thicknesses of the electrode layer WL and the layer-to-be-etched 52 can be set, for example, to about 10 nm to 50 nm.

The thickness of the oxidized layer 40 is not particularly limited, however, if it is made too thin, there is a risk that an effect of an oxygen supply mentioned below is reduced. On the other hand, if it is made too thick, there is a risk that a formation of the hole 70 mentioned below is hard to be carried out. Accordingly, it is favorable to make the thickness of the oxidized layer 40 not less than 1 nm, and not more than 10 nm.

Figure 4A:
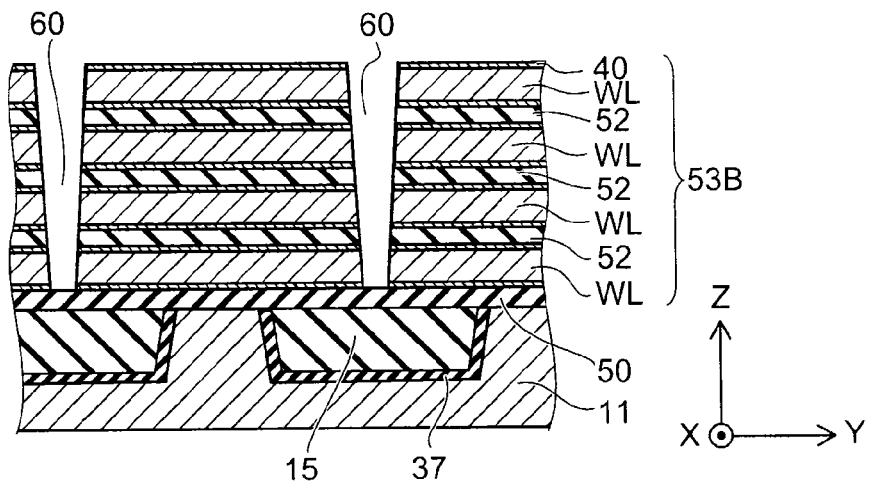
FIG. 4A to FIG. 4C are schematic process cross sectional views for illustrating the method for manufacturing the nonvolatile semiconductor memory device 1 according to the first embodiment.

A display of the foundation layer 12 is omitted after FIG. 4A.

As shown in FIG. 4A, a slit 60 (a groove) which reaches the insulating layer 50 from the surface of the stacked body 53B is formed by using a photolithography method and an RIE method. In other words, the groove which passes through the stacked body 53B in a stacking direction is formed. The slit 60 extends in the X direction. In this stage, the stacked body 53B is segmented in the Y direction by the slit 60. At this time, the insulating layer 50 serves as an etching stop layer. In other words, an over etching is suppressed on the basis of an existence of the insulating layer 50, and a lower end of the slit 60 does not reach the additive-free silicon sacrifice layer 15.

Figure 4B:
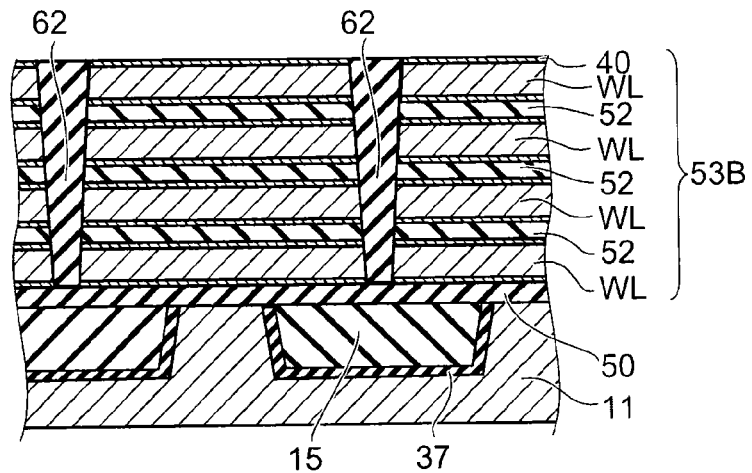

Next, as shown in FIG. 4B, the insulating layer 62 is formed within the slit 60. In other words, the insulating body is embedded within the slit 60. A material of the insulating layer 62 is, for example, a silicon nitride ($Si_3N_4$). The insulating layer 62 is removed its surplus portion according to an etch back as occasion demands, and the oxidized layer 40 in the top layer is exposed.

Figure 4C:
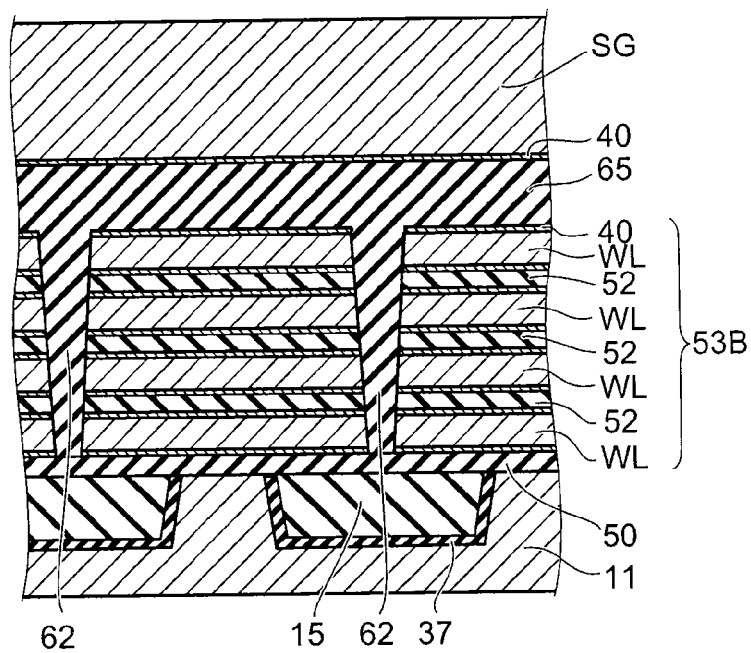

Next, as shown in FIG. 4C, an interlayer insulating layer 65 is formed on the stacked body 53B and on the insulating layer 62. The interlayer insulating layer 65 is, for example, a silicon oxide layer.

Subsequently, the oxidized layer 40 is formed on the interlayer insulating layer 65 as occasion demands.

Subsequently, the selector gate SG is formed on the interlayer insulating layer 65 via the oxidized layer 40. The oxidized layer 40 can also be provided between the interlayer insulating layer 65 and the selector gate SG. A material of the selector gate SG is, for example, a boron added polysilicon.

Further, an oxidized layer which is provided for protecting the selector gate SG and is not illustrated can be formed on the selector gate SG.

Figure 5A:
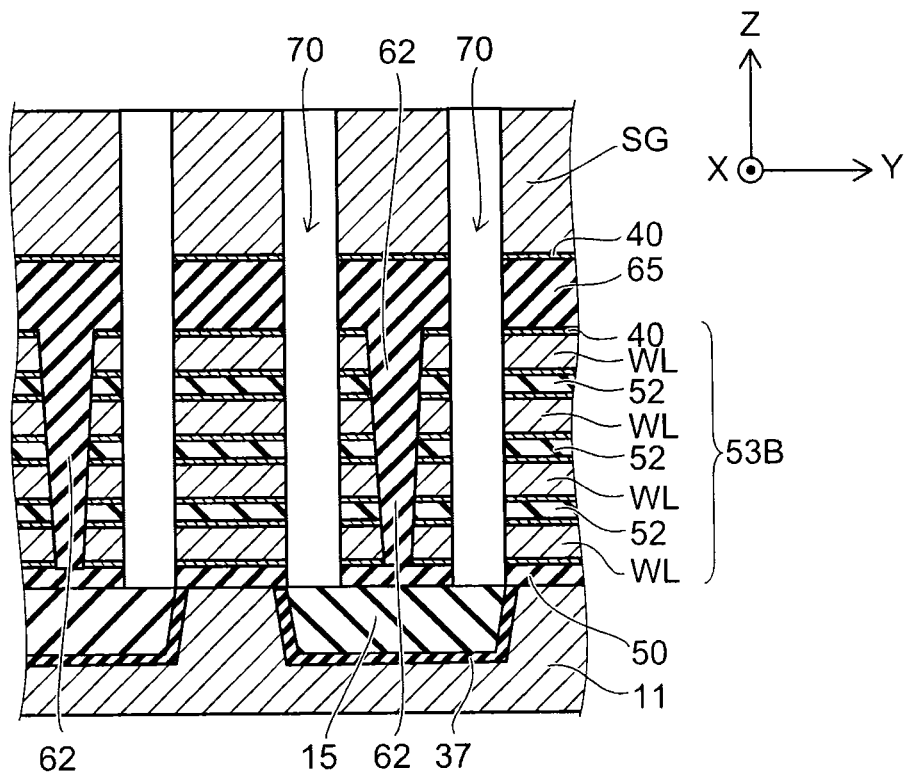
FIG. 5A and FIG. 5B are schematic process cross sectional views for illustrating the method for manufacturing the nonvolatile semiconductor memory device 1 according to the first embodiment.

Next, as shown in FIG. 5A, the hole 70 passing through the stacked body 53B in the stacking direction is formed by using the photolithography method and the RIE method. For example, a pair of holes 70 which reach the additive-free silicon sacrifice layer 15 (the etched region) are formed in the stacked body 53B. A pair of holes 70 pinch the insulating layer 62, and pass through from an upper face to a lower face of the stacked body 53B. Further, the layer-to-be-etched 52 which is provided respectively between a plurality of electrode layers WL is exposed in an inner side of a pair of holes 70.

Figure 5B:
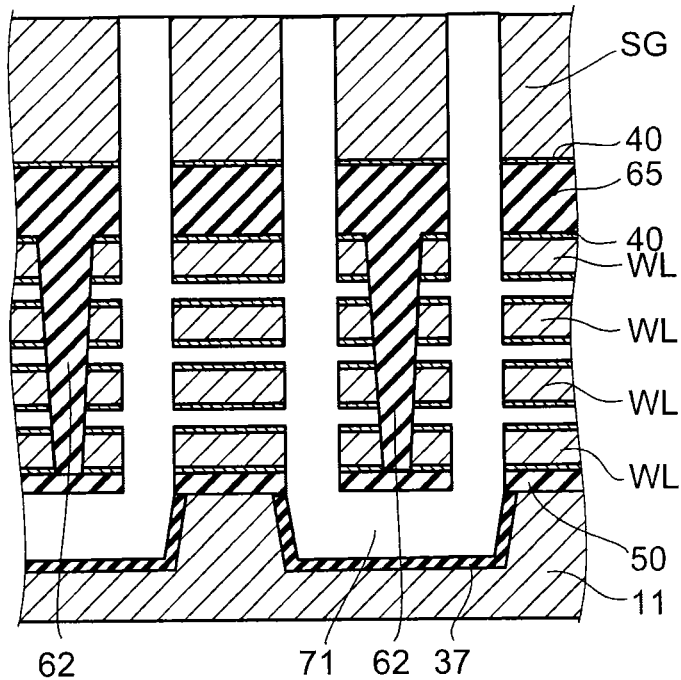

Next, as shown in FIG. 5B, the layer-to-be-etched 52 is selectively removed via the hole 70. For example, the additive-free silicon sacrifice layer 15 (the etched region) and the layer-to-be-etched 52 provided respectively between a plurality of electrode layers WL are removed through a pair of holes 70. For example, the additive-free silicon sacrifice layer 15 and the layer-to-be-etched 52 are removed by introducing a predetermined removing liquid into the hole 70. As the removing liquid, for example, a choline water solution (TMY) or the like can be used.

In this case, the electrode layer WL is, for example, the boron added polysilicon layer. On the other hand, the layer-to-be-etched 52 is the additive-free polysilicon layer, and the additive-free silicon sacrifice layer 15 is a non-doped silicon layer. Further, the oxidized layer 40 is formed from the oxide.

Accordingly, the additive-free silicon sacrifice layer 15 and the layer-to-be-etched 52 are selectively removed by the choline water solution or the like.

As a result, a space portion (a concave portion) 71 which is connected to a lower end of each of a pair of holes 70 is formed in the semiconductor layer 11. Further, the surface of the oxidized layer 40 is exposed.

Next, as shown in FIG. 6A, the memory layer 30A including the charge storage layer 32 is formed in an inner side of each of a pair of holes 70. Further, the insulating layer 30B is formed respectively between a plurality of electrode layers WL. Further, an insulating layer 30C including the charge storage layer 32 is formed in an inner wall of the space portion 71. The memory layer 30A, the insulating layer 30B and the insulating layer 30C are formed, for example, according to an atomic layer deposition (ALD) method.

Subsequently, the channel body layer 20 is formed in an inner side of the memory layer 30A including the charge storage layer 32, and the insulating layer 30C. With regard to the channel body layer 20, a mode that the channel body layer 20 is formed as a tubular shape without being fully filled is included in the embodiment, in addition to the mode that it is fully filled in the hole 70 and in the space portion 71.

Next, as shown in FIG. 6B, the selector gate SG is separated by using the photolithography method and the RIE method, so as to form the drain side selector gate SGD and the source side selector gate SGS. Thereafter, the nonvolatile semiconductor memory device 1 is manufactured by forming the other members (the contact electrode, the wiring and the like).

The nonvolatile semiconductor memory device 1 shown in FIG. 6B is provided with the semiconductor layer 11 including the impurity element. The semiconductor layer 11 corresponds to the back gate BG illustrated in FIG. 1.

Further, the nonvolatile semiconductor memory device 1 is provided with the insulating layer 30C which is provided on the surface of the semiconductor layer 11. The nonvolatile semiconductor memory device 1 has a plurality of electrode layers WL and a plurality of insulating layers 30B which are respectively stacked alternately on the semiconductor layer 11 and on the insulating layer 30C, and is provided with the stacked body 53A including the oxidized layer 40 which is provided respectively between a plurality of electrode layers WL and a plurality of insulating layers 30B. A plurality of electrode layers WL are the electrode layer WL1D, the electrode layer WL2D, the electrode layer WL3D, the electrode layer WL4D, the electrode layer WL1S, the electrode layer WL2S, the electrode layer WL3S and the electrode layer WL4S.

The nonvolatile semiconductor memory device 1 is provided with the charge storage layer 32 which is provided in the side wall of each of a pair of holes 70 formed by passing through the stacked body 53A in the stacking direction of the stacked body 53A.

The nonvolatile semiconductor memory device 1 is provided with the channel body layer 20 which is provided in the inner side of the charge storage layer 32 in each of a pair of holes 70.

The nonvolatile semiconductor memory device 1 is provided with a stacked body 54 which is provided on the stacked body 53A. The stacked body 54 has the interlayer insulating layer 65, and the selector gate SG which is provided on the interlayer insulating layer 65. The selector gate SG is the drain side selector gate SGD and the source side selector gate SGS. The oxidized layer 40 may be provided between the interlayer insulating layer 65 and the selector gate SG.

The nonvolatile semiconductor memory device 1 is provided with the gate insulating layer GD which is provided in the side wall of the hole 70 formed so as to pass through the stacked body 54 in a stacking direction of the stacked body 54. The gate insulating layer GD is the gate insulating layer GD of the drain side selector gate SGD and the gate insulating layer GD of the source side selector gate SGS.

The nonvolatile semiconductor memory device 1 is provided with the channel body layer 20 in the inner side of the gate insulating layer GD within the hole 70.

In the nonvolatile semiconductor memory device 1, the lower ends of the channel body layers 20 which are provided within a pair of holes 70 are connected to each other within the insulating layer 30C. The insulating layer 30C serves as a back gate insulating layer of the back gate BG.

The nonvolatile semiconductor memory device 1 is provided with the insulating layer 62 which is pinched between a pair of holes 70, and passes through the stacked body 53A from the surface of the stacked body 53A so as to reach the insulating layer 50.

Next, an effect obtained by providing the oxidized layer 40 at least any side of the upper side and the lower side of the electrode layer WL will be illustrated.

In the manufacturing of the nonvolatile semiconductor memory device 1, it is necessary to form the hole 70 having a high aspect ratio as illustrated in FIG. 5A.

Here, in the case of etching the hole or the like having the high aspect ratio by using the RIE method, the hole is etched while forming a protection film on the side wall of the hole, for enhancing a shape controllability of the formed hole or the like. For example, in the case of etching by using a gas including an oxygen gas and a bromine (Br) gas, the hole is etched while forming the protection film made of a chemical compound including the oxygen and the bromine in the side wall of the hole.

However, since the oxygen gas is hard to be supplied to a bottom portion side such as the hole having the high aspect ratio or the like, the protection film is hard to be formed in the bottom portion side. Accordingly, there is a risk that it becomes hard to carry out an etching process which is excellent in the shape controllability.

In the embodiment, since the oxidized layer 40 is provided at least in any side of the upper side and the lower side of the electrode layer WL, it is possible to supply the oxygen from the oxidized layer 40 at a time of the etching process. Accordingly, since it is possible to supply the oxygen to the bottom portion side such as the hole having the high aspect ratio or the like, the protection film can be easily formed in the bottom portion side. As a result, it is possible to carry out the etching process which is excellent in the shape controllability with respect to the hole having the high aspect ratio or the like. For example, it is possible to form a cross sectional shape of the hole 70 as a shape which is close to a straight shape.

In this case, on the assumption that a layer made of the silicon nitride ($Si_3N_4$) is used in place of the oxidized layer 40, since it does not come to a supply source of the oxygen, there is a risk that it becomes hard to carry out the etching process which is excellent in the shape controllability. Further, there is a risk that the electric charge of the electrode layer WL is trapped in the layer made of the silicon nitride during a motion of the nonvolatile semiconductor memory device 1, thereby causing an erroneous motion.

Further, if the oxidized layer 40 is provided, an effect illustrated below can be obtained.

For example, as illustrated in FIG. 3C, if the electrode layer WL corresponding to the boron added polysilicon layer, and the layer-to-be-etched 52 corresponding to the additive-free polysilicon layer are repeatedly stacked alternately, there is a case that an abnormal growth of the polysilicon layer is generated. For example, there is a case that a convex portion is formed in the layer-to-be-etched 52.

In the embodiment, since the oxidized layer 40 is provided at least in any side of the upper side and the lower side of the electrode layer WL, it is possible to suppress the abnormal growth of the polysilicon layer.

Further, there is a risk that the impurity element included in the electrode layer WL is diffused into the layer-to-be-etched 52 by a heat which is generated by the film forming process. If the impurity element included in the electrode layer WL is diffused within the layer-to-be-etched 52, there is a risk that it becomes hard to remove the layer-to-be-etched 52 by the removing liquid. Further, as a result, since the concentration of the impurity element included in the electrode layer WL is lowered, and it can be easily etched by the removing liquid, the thickness of the electrode layer WL becomes thin, and there is a risk that it becomes hard to obtain a desired resistance.

In the embodiment, since the oxidized layer 40 is provided at least in any side of the upper side and the lower side of the electrode layer WL, it is possible to inhibit the impurity element from being diffused into the layer-to-be-etched 52.

Second Embodiment

Figure 7:
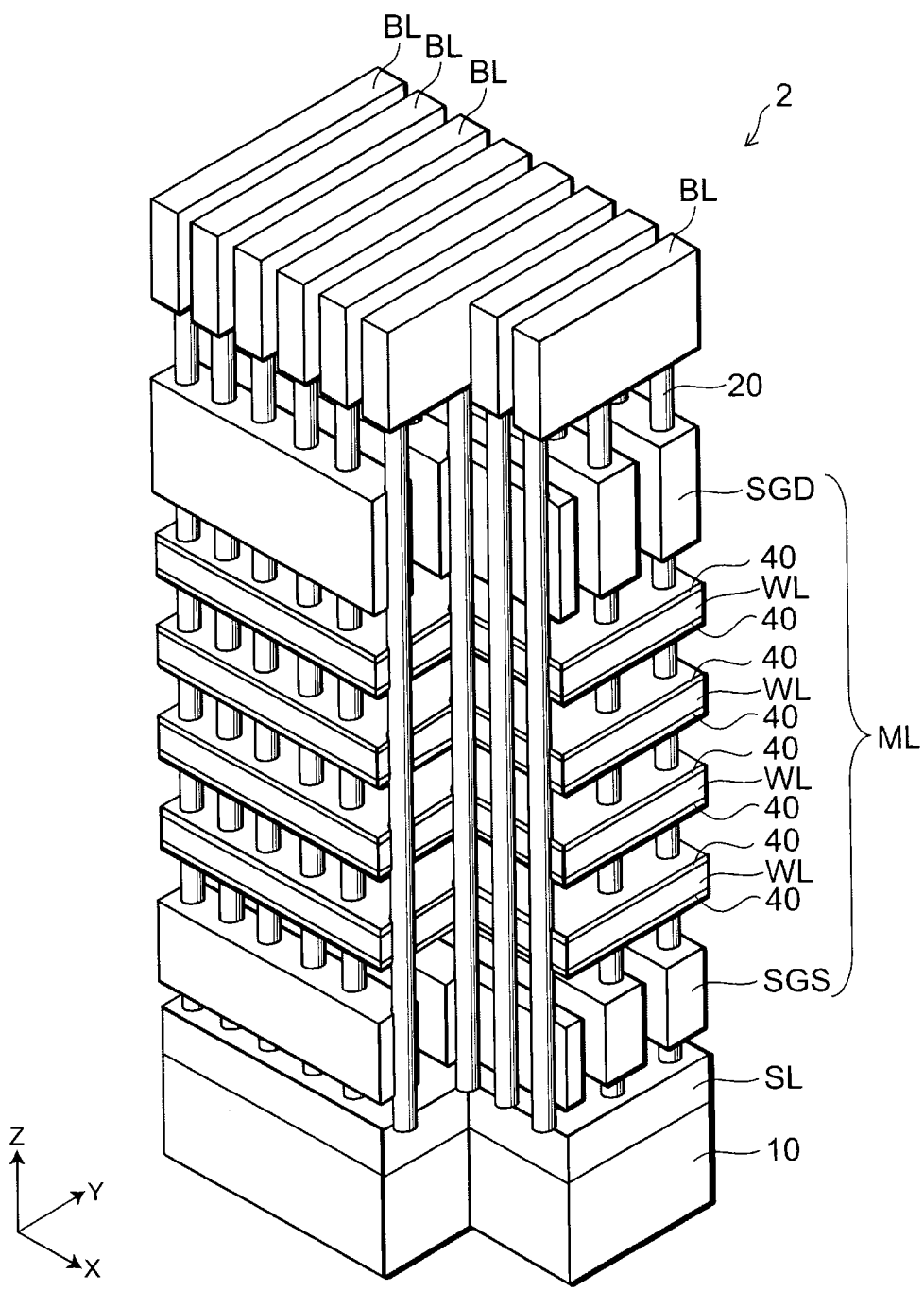
FIG. 7 is a schematic perspective view of a memory cell array in a nonvolatile semiconductor memory device according to a second embodiment.

FIG. 7 is a schematic perspective view of a memory cell array in a nonvolatile semiconductor memory device according to a second embodiment.

In FIG. 7, an illustration of an insulating portion will be omitted for making the drawing easily viewable.

The nonvolatile semiconductor memory device 1 mentioned above is the case that it has the U-shaped memory string, however, a nonvolatile semiconductor memory device 2 according to the embodiment is a case that it has an I-shaped memory string.

In the nonvolatile semiconductor memory device 2, the source line SL is provided on the board 10, and the source side selector gate (or a lower portion selector gate) SGS is provided thereon. Further, a plurality of (for example, four layers of) electrode layers WL are provided on the source side selector gate SGS, and the drain side selector gate (or an upper portion selector gate) SGD is provided between the electrode layer WL in the top layer and the bit line BL.

Further, the oxidized layer 40 is provided at least in any side of the upper side and the lower side of the electrode layer WL.

In this case, since elements provided in the nonvolatile semiconductor memory device 2 can be the same as the elements provided in the nonvolatile semiconductor memory device 1, a detailed description of the elements provided in the nonvolatile semiconductor memory device 2 will be omitted.

Further, a method for manufacturing the nonvolatile semiconductor memory device 2 is provided with the same processes as the method for manufacturing the nonvolatile semiconductor memory device 1.

In other words, the method for manufacturing the nonvolatile semiconductor memory device 2 can be configured such as to be provided with: a process of forming the stacked body 53A by alternately stacking the electrode layer WL and the layer-to-be-etched 52, and forming the oxidized layer 40 at least in any side of the upper side and the lower side of the electrode layer WL; a process of forming the hole 70 which passes through the stacked body 53A in the stacking direction; a process of selectively removing the layer-to-be-etched 52 via the hole 70; a process of forming the charge storage layer 32 in the inner side of the hole 70; and a process of forming the channel body layer 20 in the inner side of the charge storage layer 32.

In this case, since the contents in each of the processes are the same as those illustrated in the method for manufacturing the nonvolatile semiconductor memory device 1, a description of the contents will be omitted.

Further, in the method for manufacturing the nonvolatile semiconductor memory device which is illustrated above, after the layer-to-be-etched 52 is selectively removed as illustrated in FIG. 5B, the insulating layer 30B is formed respectively between the electrode layers WL as illustrated in FIG. 6A.

However, the method for manufacturing the nonvolatile semiconductor memory device is not limited to this.

For example, the method for manufacturing the nonvolatile semiconductor memory device can be configured such as to be provided with: a process of forming the stacked body by alternately stacking the electrode layer WL and the insulating layer (corresponding to one example of a first layer), and forming the oxidized layer 40 at least in any side of the upper side and the lower side of the electrode layer WL; a process of forming the hole 70 which passes through the stacked body in the stacking direction; a process of forming the charge storage layer 32 in the inner side of the hole 70; and a process of forming the channel body layer 20 in the inner side of the charge storage layer 32.

According to the embodiment illustrated above, it is possible to realize the method for manufacturing the nonvolatile semiconductor memory device which can carry out the etching process which is excellent in the shape controllability, and the nonvolatile semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A method for manufacturing a nonvolatile semiconductor memory device comprising:
   forming a stacked body by alternately stacking an electrode layer and a layer-to-be-etched, and forming an oxidized layer between the layer-to-be-etched provided at least in any side of an upper side and a lower side of the electrode layer and the electrode layer, the formation of the oxidized layer being carried out by piling up an oxide;
   forming a hole which passes through the stacked body in the stacking direction;
   selectively removing the layer-to-be-etched via the hole;
   forming a charge storage layer in an inner side of the hole; and
   forming a channel body layer in an inner side of the charge storage layer.

2. The method according to claim 1, wherein the electrode layer is a polysilicon layer to which an impurity is added.

3. The method according to claim 1, wherein the formation of the oxidized layer is carried out by piling up at least any of a silicon oxide and an aluminum oxide.

4. The method according to claim 1, wherein the layer-to-be-etched is a polysilicon layer.

5. The method according to claim 1, wherein a thickness of the layer-to-be-etched is not less than 10 nm and not more than 50 nm.

6. The method according to claim 1, wherein the removal of the layer-to-be-etched is carried out by introducing a removing liquid into the hole.

7. The method according to claim 1, further comprising:
forming a groove which passes through the stacked body in a stacking direction;
embedding an insulating body within the groove.

8. A method for manufacturing a nonvolatile semiconductor memory device comprising:
forming a stacked body by alternately stacking an electrode layer and a layer-to-be-etched, and forming an oxidized layer between the layer-to-be-etched provided at least in any side of an upper side and a lower side of the electrode layer and the electrode layer, a thickness of the oxidized layer being not less than 1 nm and not more than 10 nm;
forming a hole which passes through the stacked body in the stacking direction;
selectively removing the layer-to-be-etched via the hole;
forming a charge storage layer in an inner side of the hole; and
forming a channel body layer in an inner side of the charge storage layer.

9. The method according to claim 8, further comprising:
forming a groove which passes through the stacked body in a stacking direction;
embedding an insulating body within the groove.

10. A method for manufacturing a nonvolatile semiconductor memory device comprising:
forming a stacked body by alternately stacking an electrode layer and a layer-to-be-etched;
forming a groove which passes through the stacked body in a stacking direction;
embedding an insulating body within the groove;
forming a hole which passes through the stacked body in the stacking direction;
selectively removing the layer-to-be-etched via the hole;
forming an oxidized layer by oxidizing a surface of the electrode layer via the hole;
forming a charge storage layer in an inner side of the hole; and
forming a channel body layer in an inner side of the charge storage layer.

11. The method according to claim 10, wherein the electrode layer is a polysilicon layer to which an impurity is added.

12. The method according to claim 10, wherein a thickness of the oxidized layer is not less than 1 nm and not more than 10 nm.

13. The method according to claim 10, wherein the layer-to-be-etched is a polysilicon layer.

14. The method according to claim 10, wherein a thickness of the layer-to-be-etched 1 is not less than 10 nm and not more than 50 nm.

15. The method according to claim 10, wherein the removal of the layer-to-be-etched is carried out by introducing a removing liquid into the hole.

16. The method according to claim 10, wherein the oxidized layer includes at least any one which is selected from a group constituted by a silicon, an aluminum, group-13 elements and group-15 elements.

* * * * *